United States Patent
Chang et al.

(10) Patent No.: US 10,909,944 B2
(45) Date of Patent: Feb. 2, 2021

(54) DISPLAY PANEL AND PIXEL CIRCUIT THEREOF

(71) Applicant: Au Optronics Corporation, Hsinchu (TW)

(72) Inventors: Che-Chia Chang, Hsinchu (TW); Chun-Ru Huang, New Taipei (TW); Ming-Hung Chuang, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 277 days.

(21) Appl. No.: 15/981,900

(22) Filed: May 17, 2018

(65) Prior Publication Data
US 2018/0336861 A1    Nov. 22, 2018

(30) Foreign Application Priority Data
May 17, 2017    (TW) .............................. 106116299 A

(51) Int. Cl.
*G09G 3/36*    (2006.01)
*H01L 27/12*   (2006.01)

(52) U.S. Cl.
CPC ......... *G09G 3/3688* (2013.01); *G09G 3/3659* (2013.01); *H01L 27/124* (2013.01); *G09G 2300/0814* (2013.01); *G09G 2310/0251* (2013.01); *G09G 2320/0223* (2013.01)

(58) Field of Classification Search
CPC combination set(s) only.
See application file for complete search history.

(56) References Cited

U.S. PATENT DOCUMENTS

| 5,793,346    | A   |  8/1998 | Moon |
|--------------|-----|---------|------|
| 9,323,123    | B2  |  4/2016 | Xu |
| 9,343,030    | B2  |  5/2016 | Kim et al. |
| 2009/0079669 | A1  |  3/2009 | Huang et al. |
| 2011/0157263 | A1  |  6/2011 | Kim et al. |
| 2012/0169798 | A1* |  7/2012 | Ebisuno ................. G09G 3/325 345/690 |
| 2014/0375700 | A1* | 12/2014 | Takahama ............ G09G 3/2003 345/690 |
| 2015/0309380 | A1  | 10/2015 | Xu |
| 2019/0066603 | A1* |  2/2019 | Lee ...................... G09G 3/3233 |

FOREIGN PATENT DOCUMENTS

| CN | 102110406 |  6/2011 |
| CN | 103676385 |  3/2014 |
| TW | 200915279 |  4/2009 |
| TW | 201040926 | 11/2010 |

\* cited by examiner

*Primary Examiner* — William Boddie
*Assistant Examiner* — Alecia D English
(74) *Attorney, Agent, or Firm* — JCIPRNET

(57) ABSTRACT

A display panel and a pixel circuit thereof are provided. The display panel includes a plurality of gate lines, a plurality of data lines, and a plurality of pixel circuits. Each of the pixel circuits is coupled to corresponding gate line and data line. Each of the pixel circuits includes a first gate line and a pull-low switch. The first gate line is coupled to a control terminal of a driving transistor, and provides a first gate signal to drive the driving transistor during a driving time period. The pull-low switch pulls low the first gate signal to a reference low voltage according to a second gate signal on a second gate line when the driving time period finishes.

14 Claims, 4 Drawing Sheets

DISPLAY PANEL AND PIXEL CIRCUIT THEREOF

CROSS-REFERENCE TO RELATED APPLICATION

This application claims the priority benefit of Taiwan application serial no. 106116299, filed on May 17, 2017. The entirety of the above-mentioned patent application is hereby incorporated by reference herein and made a part of this specification.

BACKGROUND OF THE INVENTION

Field of the Invention

The invention relates to a display panel and a pixel circuit thereof, and more particularly to a display panel and a pixel circuit thereof in which charging time can be increased.

Description of Related Art

With the development of electronic technology, electronic devices have become indispensable tools in people's life. To provide a good human-machine interface, high-quality display panels have become essential components in electronic devices.

In a liquid crystal display panel, when driving a display screen, a pixel circuit charges a pixel capacitor according to display data. Due to resistive capacitive delay (RC delay), falling time of gate driving signals are long and thus the charging time is insufficient. The aforementioned situation of insufficient charging time will become more serious in future high-resolution display panels, and will reduce image quality of the display screen.

SUMMARY OF THE INVENTION

The invention provides a display panel and a pixel circuit thereof in which charging time can be effectively increased.

The display panel of the invention includes a plurality of gate lines, a plurality of data lines, and a plurality of pixel circuits. Each of the pixel circuits is coupled to a corresponding gate line and a corresponding data line. Each of the pixel circuits includes a first gate line and a pull-low switch. The first gate line of the plurality of gate lines is coupled to a control terminal of a driving transistor, and provides a first gate signal to drive the driving transistor during a driving time period. The pull-low switch is coupled to the first gate line, and pulls low the first gate signal to a reference low voltage according to a second gate signal on a second gate line when the driving time period finishes.

The pixel circuit of the invention includes a first gate line and a pull-low switch. The first gate line is coupled to a control terminal of a thin film transistor (TFT), and provides an enabled first gate signal to drive the TFT during a driving time period. The pull-low switch is coupled to the first gate line, and pulls low the first gate signal to a reference low voltage according to a second gate signal on a second gate line when the driving time period finishes.

Based on the above, in the display panel provided by the invention, when the driving time period finishes, the pixel circuit promptly pulls low the gate signal on the gate line to the reference low voltage by the pull-low switch, so as to reduce time required for falling of the voltage of the gate signal. In this way, during a limited scanning time period, there is no need to pre-disable the gate signal, and charging time of the pixel circuit becomes sufficient so that display quality can be improved.

To make the above features and advantages of the invention more comprehensible, embodiments accompanied with drawings are described in detail as follows.

DETAILED DESCRIPTION OF DISCLOSED EMBODIMENTS

Figure 1:
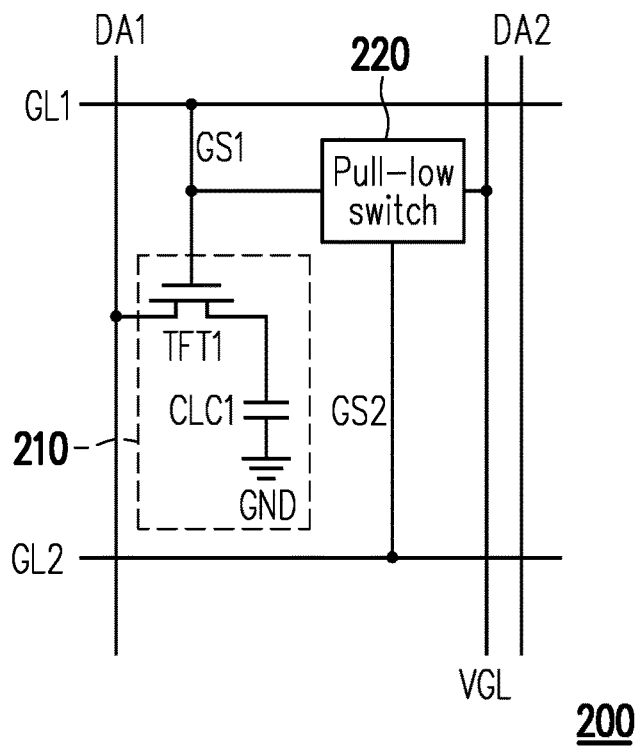
FIG. 1 illustrates a schematic diagram of a pixel circuit according to an embodiment of the invention.

Referring to FIG. 1, FIG. 1 illustrates a schematic diagram of a pixel circuit according to an embodiment of the invention. A pixel circuit 200 includes a gate line GL1, a pixel unit 210 and a pull-low switch 220, wherein the pixel unit 210 includes a driving transistor (a thin film transistor TFT1) and a pixel capacitor CLC1. One terminal of the thin film transistor TFT1 is coupled to a data line DA1, and the other terminal of the thin film transistor TFT1 is coupled to the pixel capacitor CLC1. Moreover, a gate (control terminal) of the thin film transistor TFT1 is coupled to the gate line GL. The pixel capacitor CLC1 is serially connected between the thin film transistor TFT1 and a reference voltage GND. The reference voltage GND may be a common voltage of the display panel. The gate line GL1 is configured to transmit a gate signal GS1, and to turn on the thin film transistor TFT1 through the gate signal GS1 during a driving time period. When the thin film transistor TFT1 is turned on, the pixel capacitor CLC1 is charged (or discharged) according to display data transmitted on the data line DA1, and produces a display effect.

The pull-low switch 220 is coupled to the gate line GL1 and a gate line GL2, and receives a reference low voltage VGL. When the driving time period finishes, the pull-low switch 220 is activated according to a gate signal GS2 transmitted on the gate line GL2. At this moment, the pull-low switch 220 provides a conductive path between the gate line GL and the reference low voltage VGL, and pulls low the gate signal GS1 to the reference low voltage VGL, wherein the reference low voltage VGL can be provided by a low gate voltage of the display panel or another gate line. The low gate voltage may be a constant voltage or may be the gate signal of the another gate line.

In the present embodiment, during the driving time period, the gate signal GS1 provided by the gate line GL1 is enabled (for example, pulled high to a high voltage level) so that the thin film transistor TFT1 is turned on. Moreover, during the driving time period, the gate signal GS2 provided by the gate line GL2 is in a disabled state (for example, pulled low to a low voltage level). During the driving time period, the pull-low switch 220 electrically isolates the gate line GL1 and the reference low voltage VGL from each other. Next, when the driving time period finishes, the gate signal GS1 provided by the gate line GL1 is disabled (for example, pulled low to a low voltage level), so that the thin film transistor TFT1 is turned off. Meanwhile, the gate signal GS2 provided by the gate line GL2 is enabled (for example, pulled high to a high voltage level), so that the pull-low switch 220 turns on a coupling path between the gate line GL1 and the reference low voltage VGL, and further, the voltage level of the gate signal GS1 on the gate line GL1 is promptly pulled low. Herein, the gate signal GS2 is an inverted signal of the gate signal GS1. In some embodiments of the present invention, there may be a time interval existing between the gate signal GS1 and the gate signal GS2.

From the above explanation, it is seen that the pixel circuit 200 of the present embodiment effectively reduces discharging time of the gate signal GS1 that drives the thin film transistor TFT1. It should also be mentioned that, when the driving time period finishes, fall time of the gate signal GS1 is determined according to an equivalent impedance of the coupling path (between the gate line GL1 and the reference low voltage VGL) provided by the pull-low switch 220. In detail, the lower the equivalent impedance of the coupling path, the shorter the fall time of the gate signal GS1. In contrast, the higher the equivalent impedance of the coupling path, the longer the fall time of the gate signal GS1.

In addition, in the present embodiment, a transmission wire for transmitting the reference low voltage VGL is arranged along an extension direction of the data line DA1.

Figure 2:
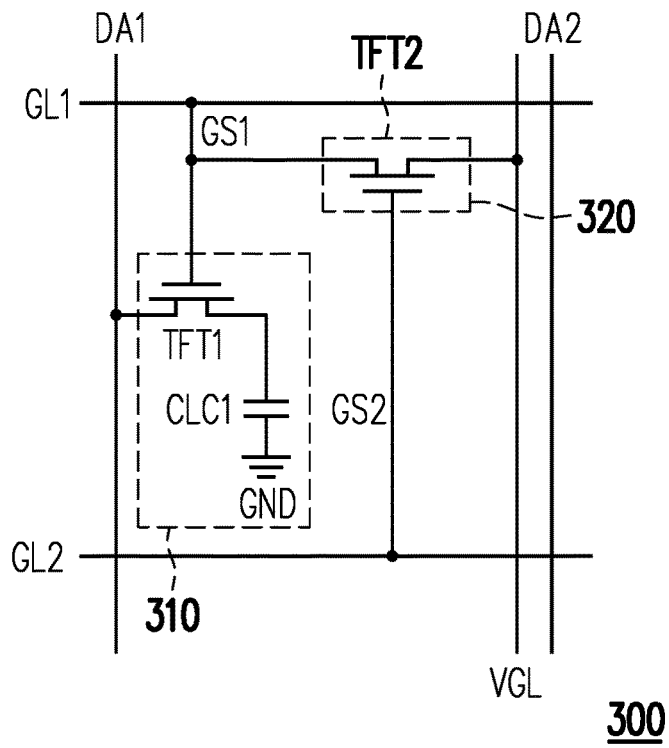
FIG. 2 illustrates a schematic diagram of a pixel circuit according to another embodiment of the invention.

Referring to FIG. 2, FIG. 2 illustrates a schematic diagram of a pixel circuit according to another embodiment of the invention. A pixel circuit 300 includes the gate line GL1, a pixel unit 310 and a pull-low switch 320, wherein the pixel unit 310 includes the thin film transistor TFT1 and the pixel capacitor CLC1. The gate of the thin film transistor TFT1 is coupled to the gate line GL1 to receive the gate signal GS1. The pixel capacitor CLC1 is serially connected between the thin film transistor TFT1 and the reference voltage GND. The reference voltage GND may be a common voltage of the display panel. When the thin film transistor TFT1 is turned on according to the gate signal GS1, the pixel capacitor CLC1 is charged (or discharged) according to a voltage value in the display data on the data line DA1.

It is worth noting that, in the present embodiment, the pull-low switch 320 includes a transistor TFT2. The transistor TFT2 has one terminal coupled to the gate line GL1 and has the other terminal coupled to the reference low voltage VGL. A control terminal (gate) of the transistor TFT2 is coupled to the gate line GL2. The transistor TFT2 may be a thin film transistor, and is turned on or off according to the gate signal GS2 transmitted by the gate line GL2. When the transistor TFT2 is turned on, a channel is formed in the transistor TFT2, and the gate line GL1 is thus coupled to the reference low voltage VGL. In this way, the gate signal GS1 on the gate line GL1 is promptly pulled low to the reference low voltage VGL through the channel formed in the transistor TFT2.

Figure 3:
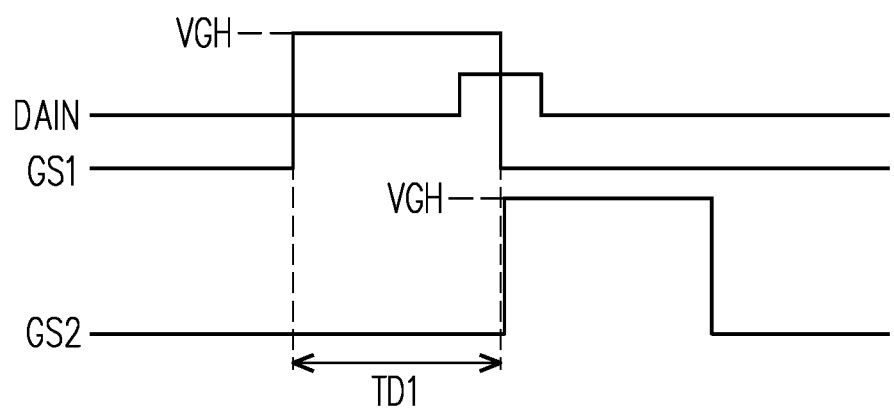
FIG. 3 illustrates a working waveform diagram of a pixel circuit according to an embodiment of the invention.

Referring to FIG. 2 and FIG. 3 together, FIG. 3 illustrates a working waveform diagram of a pixel circuit according to an embodiment of the invention. During a driving time period TD1, the gate signal GS1 transmitted by the gate line GL1 is pulled high to a reference high voltage VGH. During the driving time period TD1, the thin film transistor TFT1 is turned on, and the pixel capacitor CLC1 is charged or discharged according to display data DAIN transmitted through the data line DA1. Moreover, during the driving time period TD1, the gate signal GS2 transmitted by the gate line GL2 is maintained at a low voltage level (for example, equal to the reference low voltage VGL).

When the driving time period TD1 finishes, the gate signal GS2 is pulled high to become equal to the reference high voltage VGH. At this moment, the thin film transistor TFT1 is turned off. Moreover, the pull-low switch 320 is activated and the transistor TFT2 therein is turned on. In this way, the gate signal GS1 on the gate terminal of the thin film transistor TFT1 is promptly pulled low. Discharge delay resulting from resistive-capacitive delay (RC delay) caused by a gate capacitance of the thin film transistor TFT1 and parasitic capacitance and resistance on the gate line GL1 is thus reduced.

In the present embodiment, the gate line GL2 may be an independent signal line, transmitting the gate signal GS2 being the inverted signal of the gate signal GS1 during the driving time period. In other embodiments, the gate line GL2 may be a gate line for driving a next-stage pixel circuit.

Figure 4:
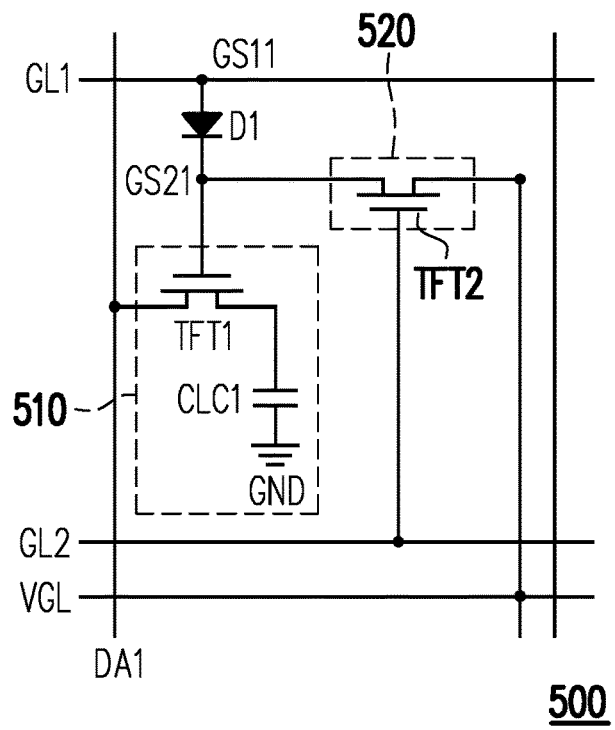
FIG. 4 illustrates a schematic diagram of a pixel circuit according to still another embodiment of the invention.

Referring to FIG. 4, FIG. 4 illustrates a schematic diagram of a pixel circuit according to still another embodiment of the invention. A pixel circuit 500 includes the gate line GL1, a pixel unit 510, a pull-low switch 520 and a diode D1, wherein the pixel unit 510 includes the thin film transistor TFT1 and the pixel capacitor CLC1. One terminal of the thin film transistor TFT1 is coupled to the data line DA1, and the other terminal of the thin film transistor TFT1 is coupled to the pixel capacitor CLC1. Moreover, the gate of the thin film transistor TFT1 is coupled to the gate line GL1. The pixel capacitor CLC1 is serially connected between the thin film transistor TFT1 and the reference voltage GND. The reference voltage GND may be a common voltage of the display panel. The pull-low switch 520 includes the transistor TFT2, wherein the transistor TFT2 is coupled between the gate of the thin film transistor TFT1 and the reference low voltage VGL, and is turned on or off according to the gate signal GS2 transmitted by the gate line GL2. An anode of the diode D1 is coupled to the gate line GL1, and a cathode of the diode D1 is coupled to the gate of the thin film transistor TFT1.

Regarding operation details, during the driving time period, the gate line GL1 transmits a gate signal GS11, and transmits a gate signal GS21 to the gate of the thin film transistor TFT1 through the turned-on diode D1, wherein a voltage value of the gate signal GS21 is equal to a value obtained by subtracting a threshold (turn-on) voltage value of the diode D1 from the voltage value of the gate signal GS11. During the driving time period, the thin film transistor TFT1 is turned on, and the pixel capacitor CLC1 is charged or discharged according to the display data transmitted by the data line DA1. During the driving time period, the transistor TFT2 is in the turned-off state.

When the driving time period finishes, the gate signal GS11 transmitted by the gate line GL falls to the reference low voltage VGL. Meanwhile, the diode D1 is turned off to electrically isolate the gate line GL1 from the gate of the thin film transistor TFT1. Meanwhile, the transistor TFT2 is turned on according to the gate signal GS2, and the voltage of the gate signal GS21 applied to the gate of the thin film transistor TFT1 is promptly pulled low according to the reference low voltage VGL. In this way, fall delay of the gate signal GS21 can be reduced.

It should also be mentioned that, in the present embodiment, the transmission wire for transmitting the reference low voltage VGL is arranged along an extension direction of the gate lines GL1 and GL2.

Figure 5:
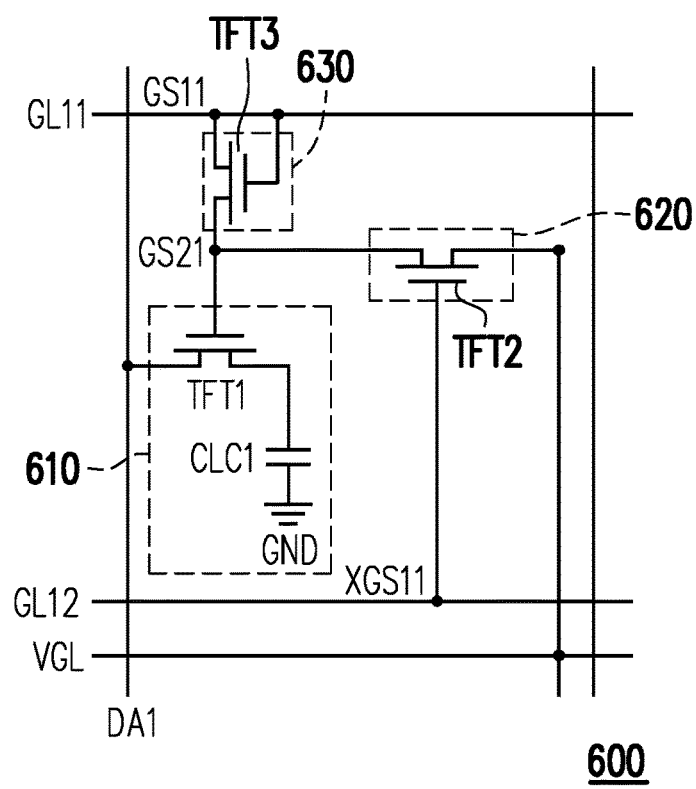
FIG. 5 illustrates a schematic diagram of a pixel circuit according to still another embodiment of the invention.

Referring to FIG. 5, FIG. 5 illustrates a schematic diagram of a pixel circuit according to still another embodiment of the invention. A pixel circuit 600 includes a gate line GL11, a pixel unit 610, a pull-low switch 620 and a diode 630. Unlike the previous embodiment, the diode 630 is composed of a transistor TFT3, wherein one terminal and a control terminal (gate) of the transistor TFT3 are both coupled to the gate line GL11, and the other terminal of the transistor TFT3 is coupled to the gate of the thin film transistor TFT1.

Regarding operation, during the driving time period, the gate line GL11 provides a gate signal GS11 being equal to a reference high voltage, and transmits the gate signal GS21 to the gate of the thin film transistor TFT1 by turning on the diode 630 composed of the transistor TFT3. Accordingly, the thin film transistor TFT1 is turned on, so that the pixel capacitor CLC1 is charged or discharged. When the driving time period finishes, the gate line GL11 provides the gate signal GS11 being equal to a reference low voltage, and turns off the diode 630. In this way, the gate line GL11 and the gate of the thin film transistor TFT1 are electrically isolated from each other. Meanwhile, a gate line GL12 provides a gate signal XGS11 being equal to the reference high voltage, so that the transistor TFT2 is turned on. By the turned-on transistor TFT2, the gate signal GS21 on the gate of the thin film transistor TFT1 is promptly pulled low to the reference low voltage VGL, and fall delay of the gate signal GS21 is reduced.

It is worth noting that, in the present embodiment, the gate signal XGS11 provided by the gate line GL12 is an inverted signal of the gate signal GS11 provided by the gate line GL11 during the driving period.

Figure 6:
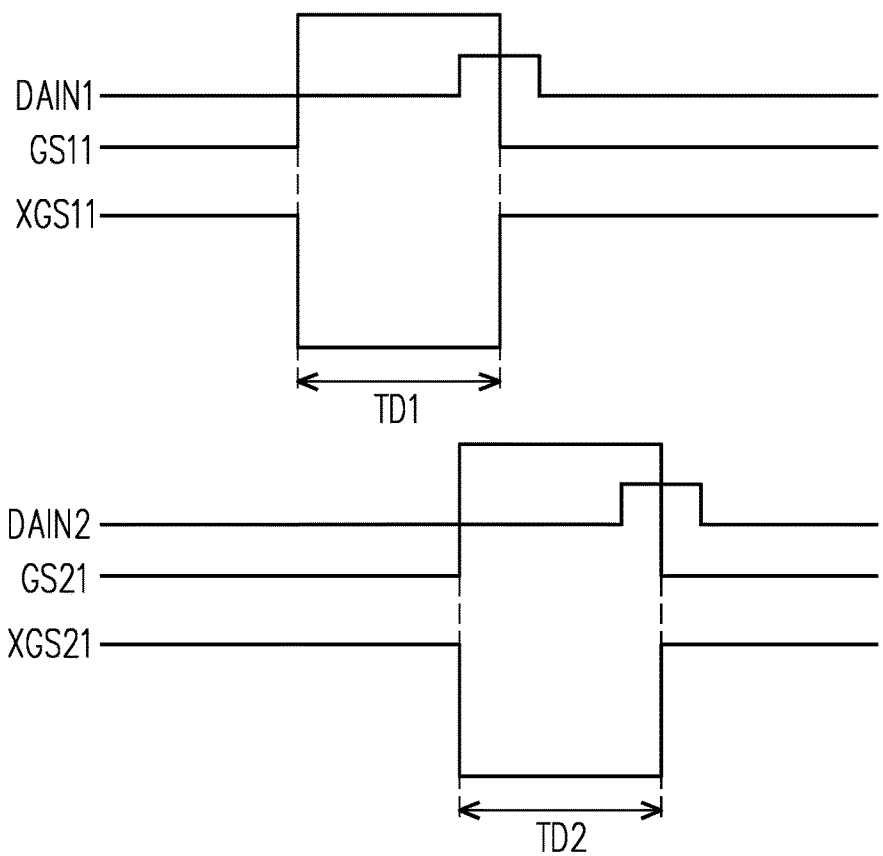
FIG. 6 illustrates an operation waveform diagram of a pixel circuit according to an embodiment of the invention.

FIG. 6 illustrates an operation waveform diagram of a pixel circuit according to an embodiment of the invention. Please refer to FIG. 6 and the embodiment shown in FIG. 5 together. The pixel circuit 600 receives the gate signals GS11 and XGS11 to perform operations, and causes the pixel capacitor CLC1 to be charged or discharged according to display data DAIN1 during the driving time period TD1. After the driving time period TD1, a voltage value of the gate signal GS11 is promptly pulled low. A next-stage pixel circuit of the pixel circuit 600 receives the gate signals GS21 and XGS21 to perform operations, and causes a pixel capacitor thereof to be charged or discharged according to display data DAIN2 during a driving time period TD2. It is worth mentioning that, in FIG. 6, time intervals during which the gate signals GS11 and GS21 are enabled may partially overlap. That is, the next-stage pixel circuit of the pixel circuit 600 can be precharged through the pre-enabled gate signal GS21. In this way, a rising waveform of the gate signal received by the control terminal of the thin film transistor in the pixel circuit can be compensated, and charging time of the capacitor is further increased.

Figure 7:
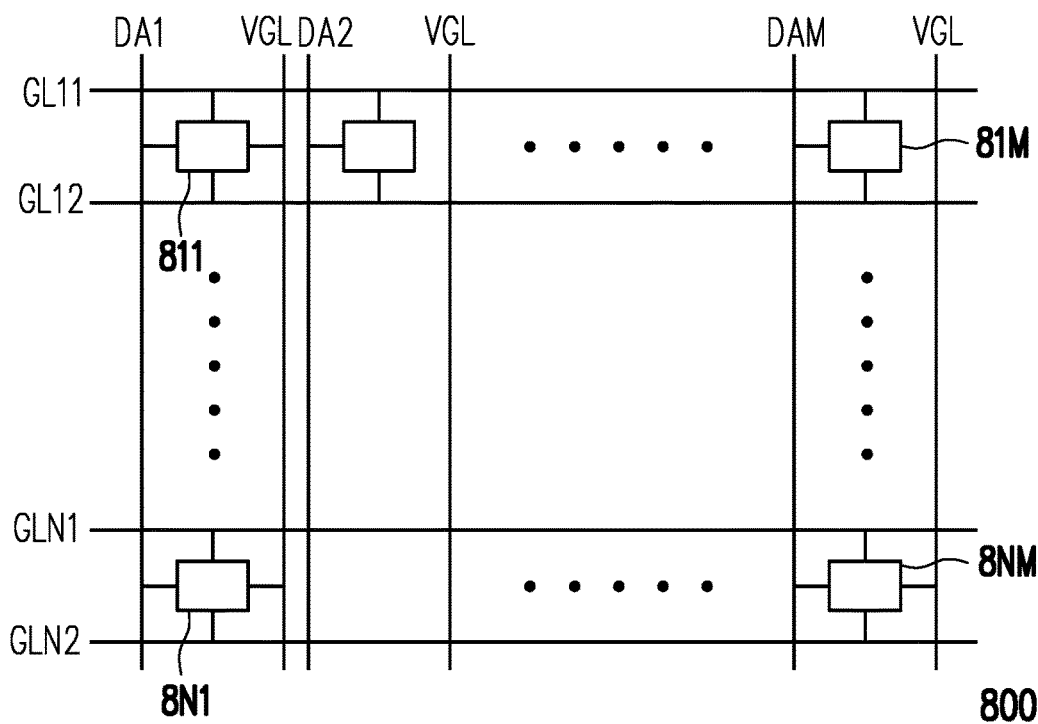
FIG. 7 illustrates a schematic diagram of a display panel according to an embodiment of the invention.

Referring to FIG. 7, FIG. 7 illustrates a schematic diagram of a display panel according to an embodiment of the invention. A display panel 800 includes a plurality of data lines DA1 to DAM, a plurality of gate lines GL11 to GLN1 and GL12 to GLN2, and a plurality of pixel circuits 811 to 8NM. The pixel circuits 811 to 8NM are respectively coupled to corresponding gate lines GL11 to GLN1 and GL12 to GLN2 and corresponding data lines DA1 to DAM. Implementation details of the pixel circuits 811 to 8NM may be understood with reference to the pixel circuits 200, 300, 500 and 600 respectively illustrated in FIGS. 1, 2, 4, and 5 of this application, and will be omitted herein.

It is worth mentioning that, taking the pixel circuit 811 as an example, the gate line GL12 to which the pixel circuit 811 is coupled to may be an independent gate line or may be a gate line of a next-stage pixel circuit of the pixel circuit 811. In addition, the arrangement direction of the transmission wire for transmitting the reference low voltage VGL in FIG. 7 is only an example. According to the descriptions of the previous embodiments, the arrangement direction of the transmission wire of the reference low voltage VGL is not limited.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A display panel, comprising:
   a plurality of gate lines;
   a plurality of data lines; and
   a plurality of pixel circuits, wherein each of the pixel circuits is coupled to a corresponding gate line and a corresponding data line, and each of the pixel circuits comprises:
   a first gate line of the plurality of gate lines, coupled to a control terminal of a driving transistor, and providing a first gate signal to drive the driving transistor during a driving time period; and
   a pull-low switch, coupled to the first gate line, for pulling low the first gate signal to a reference low voltage according to a second gate signal on a second gate line of the plurality of gate lines after the driving time period, wherein when the first gate signal is enabled, the second gate signal is disabled.

2. The display panel according to claim 1, wherein the reference low voltage is provided by a third gate line of the plurality of gate lines.

3. The display panel according to claim 1, wherein the second gate signal is an inverted signal of the first gate signal.

4. The display panel according to claim 1, wherein the pull-low switch is a transistor, a first terminal of the transistor is coupled to a control terminal of the driving transistor, a second terminal of the transistor is coupled to a gate low voltage transmission wire, and a control terminal of the transistor is coupled to the second gate line.

5. The display panel according to claim 1, wherein each of the pixel circuits further comprises:
   a diode, coupled in a coupling path between the driving transistor and the first gate line,
   wherein an anode of the diode is coupled to the first gate line, and a cathode of the diode is coupled to a control terminal of the driving transistor.

6. The display panel according to claim 5, wherein after the driving time period, the diode isolates the control terminal of the driving transistor from the first gate line.

7. The display panel according to claim 5, wherein the diode comprises:
   a transistor, having a control terminal and a first terminal both coupled to the first gate line, and having a second terminal coupled to the control terminal of the driving transistor.

8. A pixel circuit, comprising:
   a first gate line, coupled to a control terminal of a thin film transistor (TFT), and providing a first gate signal to drive the TFT during a driving time period; and
   a pull-low switch, coupled to the first gate line, and pulling low the first gate signal to a reference low voltage according to a second gate signal on a second gate line after the driving time period, wherein when the first gate signal is enabled, the second gate signal is disabled.

9. The pixel circuit according to claim 8, wherein the reference low voltage is provided by a third gate line.

10. The pixel circuit according to claim 8, wherein the second gate signal is an inverted signal of the first gate signal.

11. The pixel circuit according to claim 8, wherein the pull-low switch is a transistor, a first terminal of the transistor is coupled to a control terminal of the TFT, a second terminal of the transistor is coupled to a gate low voltage transmission wire, and a control terminal of the transistor is coupled to the second gate line.

12. The pixel circuit according to claim 8, further comprising:
   a diode, coupled between the TFT and the first gate line, wherein an anode of the diode is coupled to the first gate line, and a cathode of the diode is coupled to a control terminal of the TFT.

13. The pixel circuit according to claim 12, wherein after the driving time period, the diode isolates the control terminal of the TFT from the first gate line.

14. The pixel circuit according to claim 12, wherein the diode comprises:
   a transistor, having a control terminal and a first terminal coupled to the control terminal, and having a second terminal coupled to the control terminal of the TFT.

* * * * *